(12) United States Patent
Lin et al.

(10) Patent No.: US 7,524,773 B2
(45) Date of Patent: Apr. 28, 2009

(54) ANTI-REFLECTIVE SUBSTRATE AND THE MANUFACTURING METHOD THEREOF

(75) Inventors: Chiung-Wei Lin, Taipei (TW); Chein-Fu Teng, Taipei (TW); Yi-Liang Chen, Taipei (TW)

(73) Assignees: Tatung Company, Taipei (TW); Tatung University, Taipei (TW)

( * ) Notice: Subject to any disclaimer, the term of this patent is extended or adjusted under 35 U.S.C. 154(b) by 203 days.

(21) Appl. No.: 11/390,223

(22) Filed: Mar. 28, 2006

(65) Prior Publication Data

US 2007/0105266 A1 May 10, 2007

(30) Foreign Application Priority Data

Nov. 10, 2005 (TW) .............................. 94139436 A

(51) Int. Cl.
*H01L 21/302* (2006.01)
(52) U.S. Cl. .............................. 438/753; 257/E21.029; 257/E21.035
(58) Field of Classification Search ................. 438/753, 438/758, 759, 767, 689, 745; 257/646, E21.029, 257/E21.03, E21.033; 428/FOR. 135
See application file for complete search history.

(56) References Cited

U.S. PATENT DOCUMENTS

| | | | |
|---|---|---|---|
| 4,137,123 A | 1/1979 | Bailey et al. ................. 156/647 |
| 4,252,865 A | 2/1981 | Gilbert et al. ................ 428/611 |
| 4,348,254 A | 9/1982 | Lindmayer ................... 156/647 |
| 5,626,967 A * | 5/1997 | Pramanick et al. ........... 428/446 |
| 5,641,708 A * | 6/1997 | Sardella et al. .............. 438/592 |
| 5,960,268 A * | 9/1999 | Aihara ........................ 438/166 |
| 2002/0119290 A1 | 8/2002 | Park et al. ................... 428/156 |
| 2003/0181014 A1 | 9/2003 | Ohta et al. ................... 438/294 |
| 2005/0104163 A1 | 5/2005 | Weber et al. ................. 257/629 |

FOREIGN PATENT DOCUMENTS

EP 0 724 299 A3 4/1997

* cited by examiner

*Primary Examiner*—Brook Kebede
(74) *Attorney, Agent, or Firm*—Bacon & Thomas, PLLC

(57) ABSTRACT

The present invention is to provide an anti-reflective substrate, and the manufacturing method of the substrate. The method comprises the steps of: (a) providing a substrate; (b) depositing an amorphous silicon layer on the substrate; and (c) etching the amorphous silicon layer and the substrate by chemical etching in solutions, and the amorphous silicon layer is removed by the solutions. The effective reflectance of the anti-reflective substrate produced from the method of the present invention can be lower than 1%, and the absorption rate of the anti-reflective substrate is preferably from 70% to 90% in a wavelength range of 300 nm-900 nm.

20 Claims, 8 Drawing Sheets

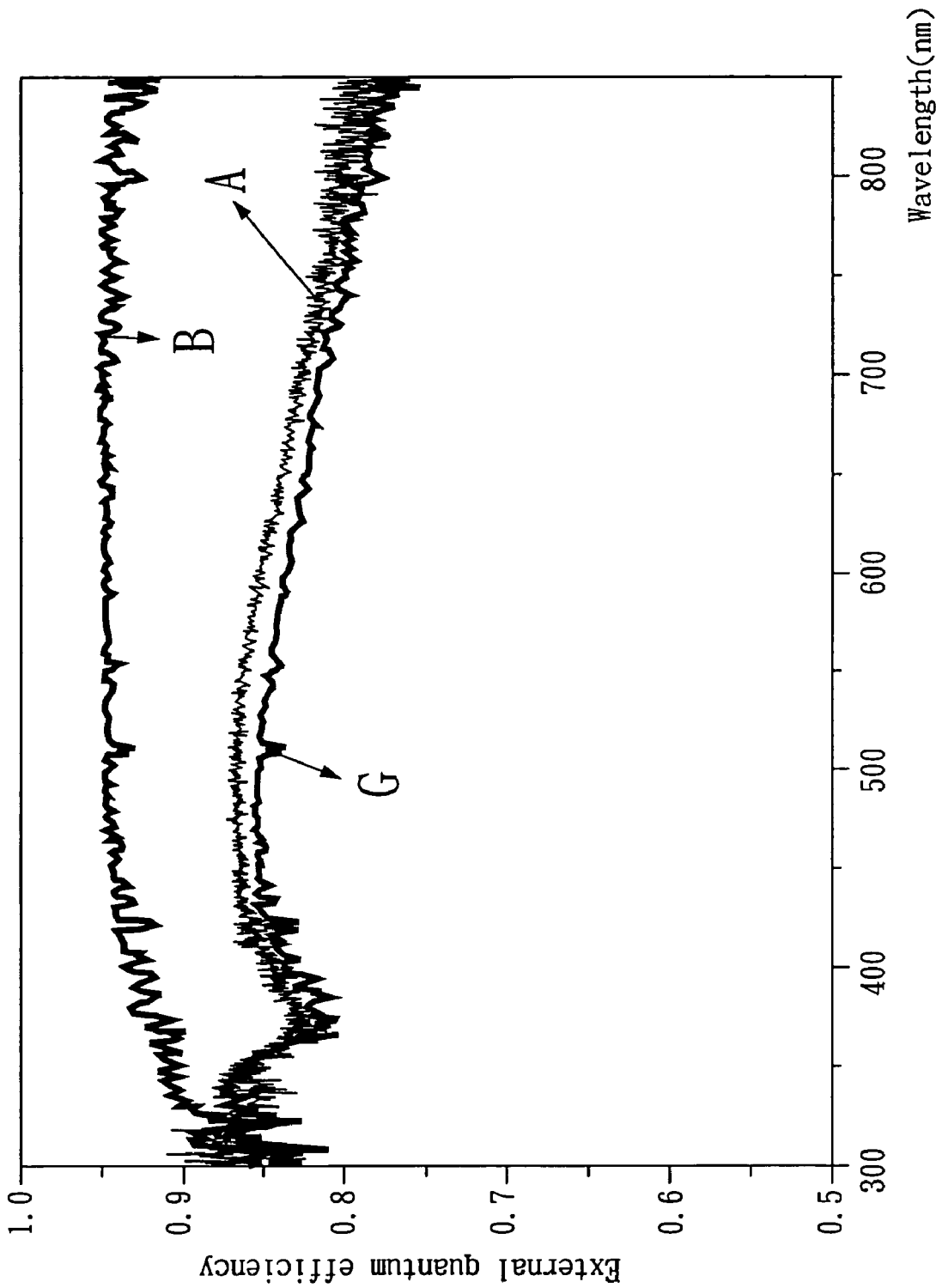

ANTI-REFLECTIVE SUBSTRATE AND THE MANUFACTURING METHOD THEREOF

BACKGROUND OF THE INVENTION

1. Field of the Invention

The present invention relates to an anti-reflective substrate and, more particularly, to an anti-reflective substrate with highly rugged surface and the method of manufacturing the same.

2. Description of Related Art

Currently, the energy source of an optoelectronic device is from electrons transferred by photo-electric conversion. The less the light reflective ratio of the device is (more light is absorbed by the surface of the device), the higher the intensity can be obtained. Therefore, the investigation of methods for producing anti-reflective layers of optoelectronic devices with high anti-reflective efficiency is very important.

Among the conventional methods to receive more light, one is to enhance the transmittance of incidental light by forming an anti-reflective membrane on the surface of optoelectronic devices, and another one is to etch the substrate to increase the surface area by etched porous.

There are several methods for etching the surface of the substrate. "Poly silicon dry etching" is to form a poly silicon layer on the silicon wafer first, and etch by high density plasma etching system. However, the system is very rarely used because of high cost, and additional preparation steps of the poly silicon material are required. Therefore, the shortcomings of high cost and complex process limit the use of the method. "Poly silicon wet etching" has the same shortcomings as dry etching described above. Referring to FIG. 1, the results of the substrate surface treated with "poly silicon dry etching" and "poly silicon wet etching" separately are shown. FIG. 1A shows the absorption of the poly silicon substrate surface after dry etching, and FIG. 1B shows that from poly silicon substrate surface after wet etching. Both of the two results only show a better absorption at wavelength of 700 nm. This indicates that the two methods are not able to absorb the light within a broad wavelength range, and this might also be a shortcoming of these conventional methods.

Another method for treating the substrate is "wet etching" the surface of the silicon wafer directly. Nevertheless, the etched surface is not adequately smooth because the etching state is difficult to control.

An electrochemical method is also used to form anti-reflective layers directly on substrates. In the electrochemical method, a bias is applied under the wafer, and a direction is provided whereby the wafer is etched. However, the method incurs the same defects as the wet etching method does, i.e., it is very difficult to control the etching state, and only a nearly smooth surface is eventually obtained.

The conventional methods described above suffer from the difficulty to control the etching state, and thus increase the complexity of the process. Further, the devices produced from the conventional method above can be operated within a narrow range of wavelength, that means the reflective efficiency of the devices is high, and the energy transferring efficiency is low because most light is reflected from the device. Hence, a reflective layer having a high absorption within a broad range of wavelength is beneficial to keep light inside the device. Thus, there is an urgent need for a reflective layer with high absorption, and the method for making the reflective layer to be developed.

SUMMARY OF THE INVENTION

The object of the present invention is to provide an anti-reflective substrate, and the manufacturing method of the substrate. The method comprises the steps of: (a) providing a substrate; (b) depositing an amorphous silicon layer on the substrate; and (c) etching the amorphous silicon layer and the substrate by chemical etching in solutions, and the amorphous silicon layer is removed by the solutions.

The substrate utilized in step (a) of the present invention can be any substrate used in the conventional method, but preferably is a silicon wafer, a glass substrate, a metal substrate, or a plastic substrate. The amorphous silicon layer can be deposited thoroughly on the substrate of a silicon wafer hence, the most preferable substrate utilized in step (a) of the present invention is a silicon wafer.

To deposit the amorphous silicon layer on the substrate, the suitable deposition method of the present invention is not limited. Preferably, physical vapor deposition (PVD) or chemical vapor deposition (CVD) can be performed in step (b). The thickness of the amorphous silicon layer deposited on the substrate in step (b) is not limited, but preferably is in a thickness of 0.5 μm-5 μm.

The chemical etching solutions in step (c) of the present invention are used to etch the amorphous silicon layer. The surface of the substrate is also etched because of the amorphous silicon layer on the substrate is formed as a sacrificial layer, and the amorphous silicon layer is finally removed completely. The solutions used in etching can be any chemical solutions or mixtures in the conventional method. Preferably, the solutions are hydrofluoric acid, sulfuric acid, nitric acid, phosphoric acid, or the mixture thereof. Furthermore, the etching process of the present invention can be any conventional one, but preferably is a wet etching process.

The reflectance of the anti-reflective substrate produced from the method of the present invention can be lower than 1%, and the absorption rate of the anti-reflective substrate is preferably from 70% to 90% in a wavelength range of 300 nm-900 nm; and more preferably, the absorption rate is greater than 80% in a wavelength range of 400 nm-800 nm.

The present invention discloses a simple method to manufacture an anti-reflective substrate, and the light reflectance is lower than any anti-reflective substrates, or anti-reflective layers produced from conventional methods. This infers that the energy transferring efficiency of the present anti-reflective substrates is higher than conventional anti-reflective substrates.

Other objects, advantages, and novel features of the invention will become more apparent from the following detailed description when taken in conjunction with the accompanying drawings.

Figure 4A:
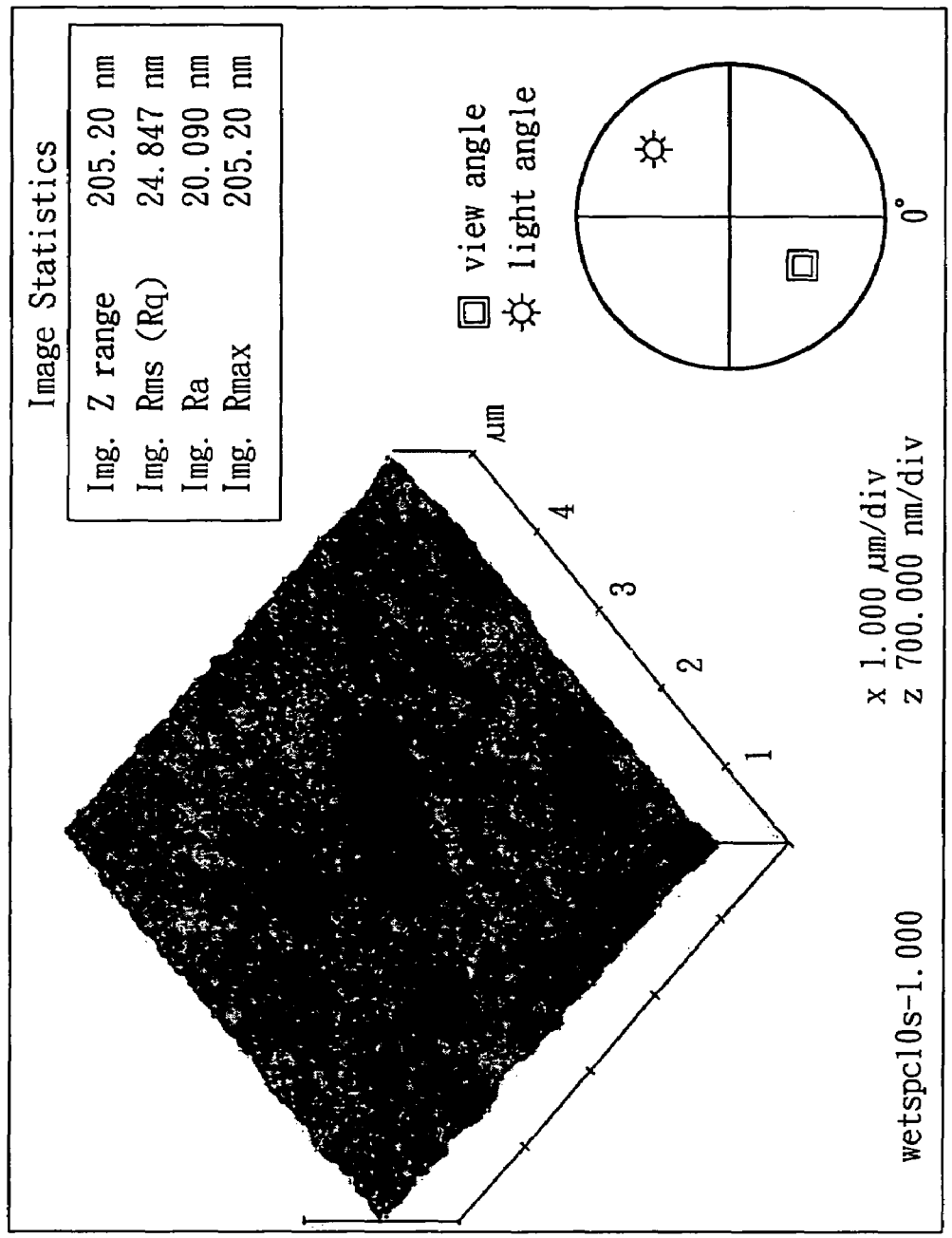
Figure 4B:
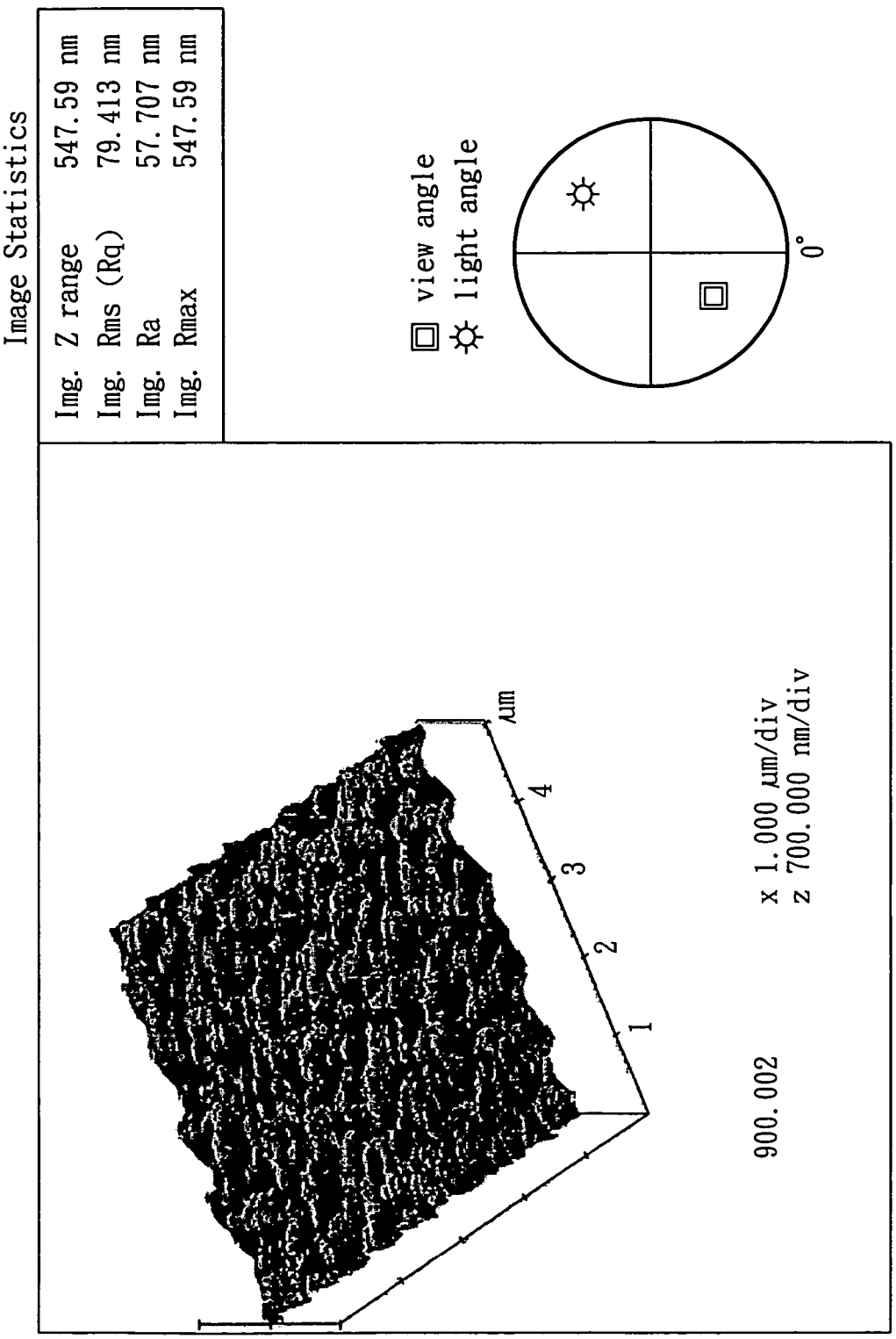
Figure 5:
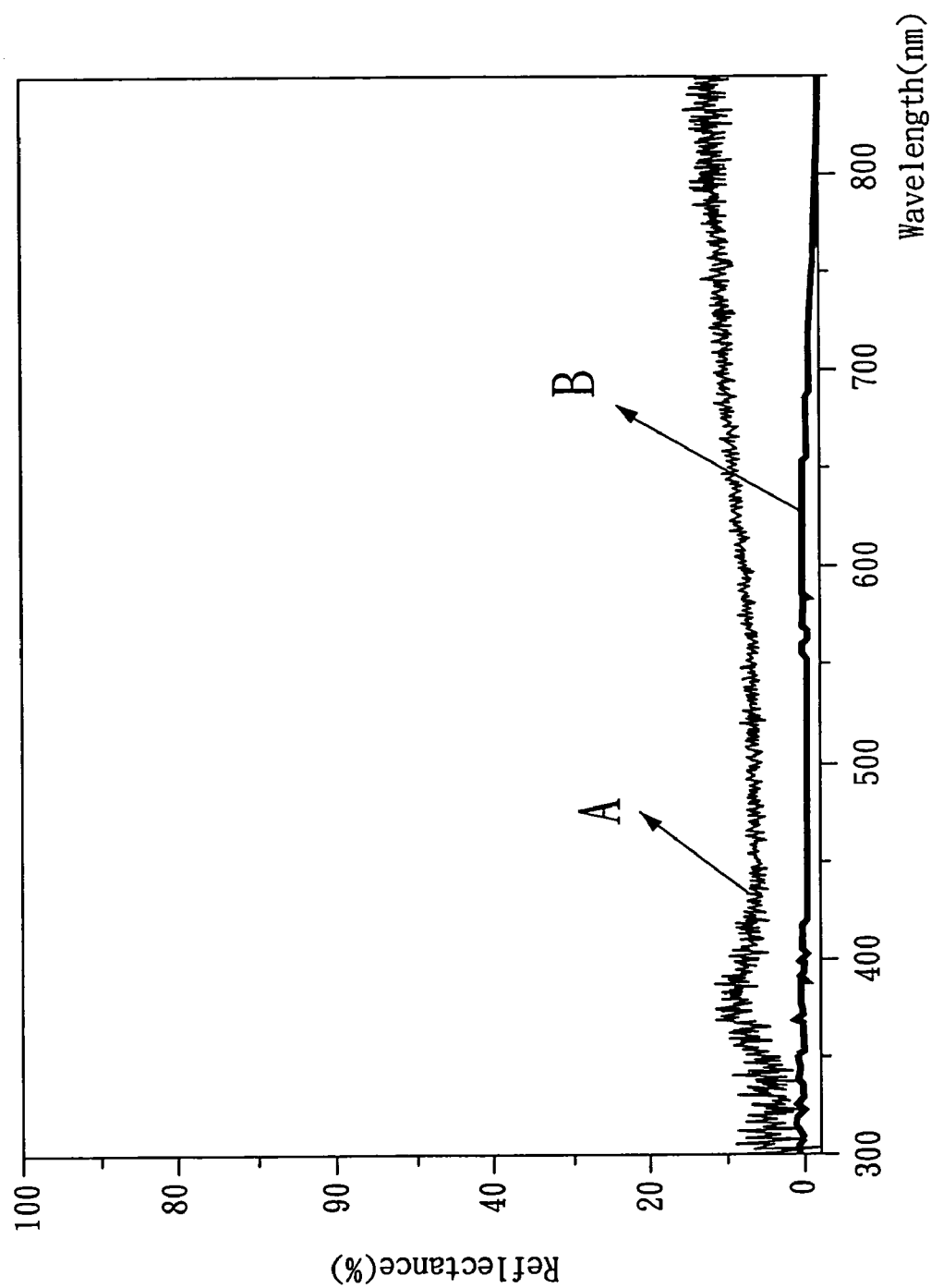
Figure 6:
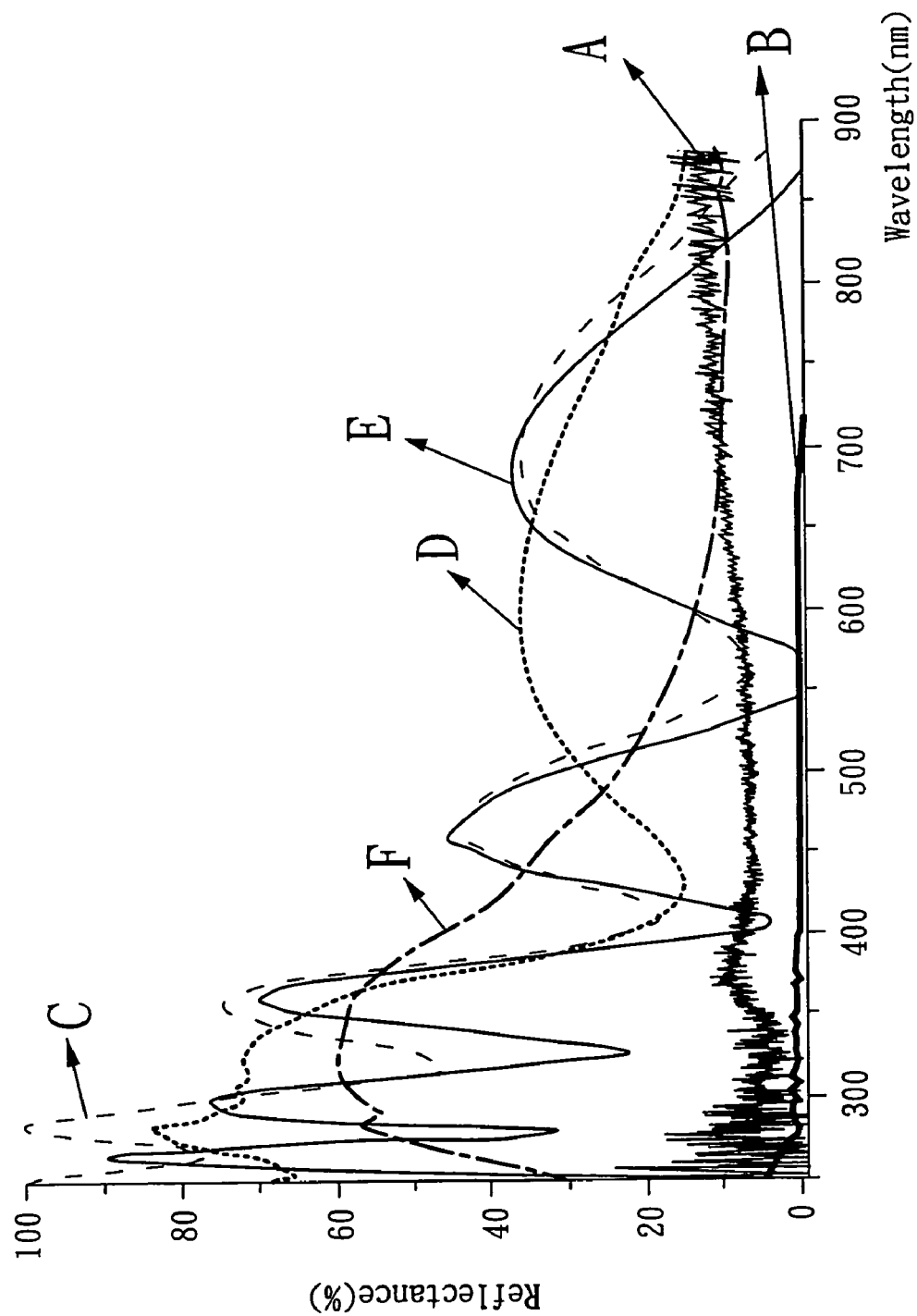

3(b) shows the morphology of the amorphous silicon substrate with porous structure in a 10,000× ratio;

FIG. 4 represents the surface morphology of example 3 by AFM, FIG. 4(a) represents the surface morphology of a conventional poly silicon substrate with porous structure, and FIG. 4(b) shows the surface morphology of the present invention;

FIG. 5 represents the reflectance of both conventional poly silicon substrate with porous structure (curve A) and the amorphous silicon substrate with porous structure (curve B) in example 4;

FIG. 6 illustrates the reflectance results of substrates having different anti-reflection layers in example 4; and FIG. 7 shows the external quantum efficiency of the conventional poly silicon substrate with structure (curve A), the amorphous silicon substrate with porous structure (curve B), and the wet-etched (curve G).

DETAILED DESCRIPTION OF THE PREFERRED EMBODIMENT

Example 1

A manufacturing method of an anti-reflective silicon wafer is explained as an embodiment. First, a 1 μm-thick amorphous silicon thin film is deposited on the surface of silicon wafer by using physical vapor deposition (PVD) process under 70° C.-90° C. The amorphous silicon thin film is to be a sacrificed layer in subsequent steps. The surface of the substrate is etched to become a porous textured structure in the etching solution ($HF:HNO_3=100:1$). Ultrasonic vibration is also performed while etching to ensure uniform etching and thus keeps the surface of the substrate in a highly rugged condition.

After etching, the substrate is rinsed in DI water and dried with nitrogen gas, whereafter excess mist is removed by baking, and an anti-reflective substrate is obtained.

In addition, a conventional poly silicon substrate with porous structure is provided as a comparison example. An amorphous silicon thin film is deposited on the surface of silicon wafer. After annealing, re-crystallization, a poly silicon thin film is thus formed. Subsequently, the same procedure as described above is followed to prepare a conventional poly silicon substrate with porous structure as a comparison.

Figure 1A:
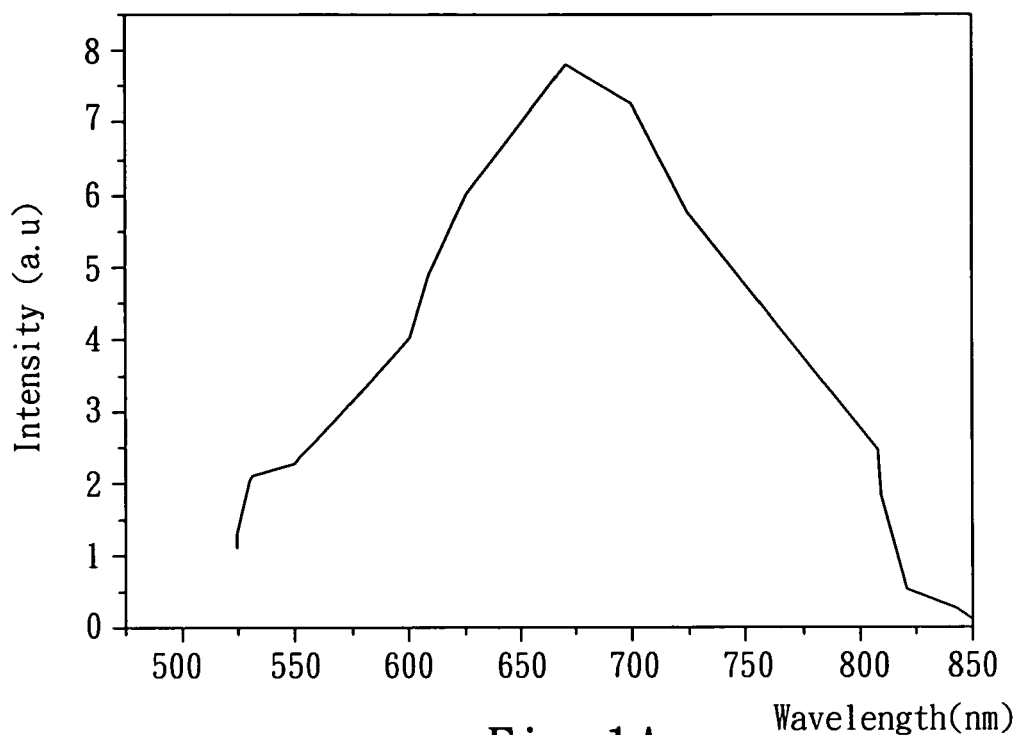
FIG. 1A shows the absorption of the poly silicon substrate after dry etching.
Figure 1B:
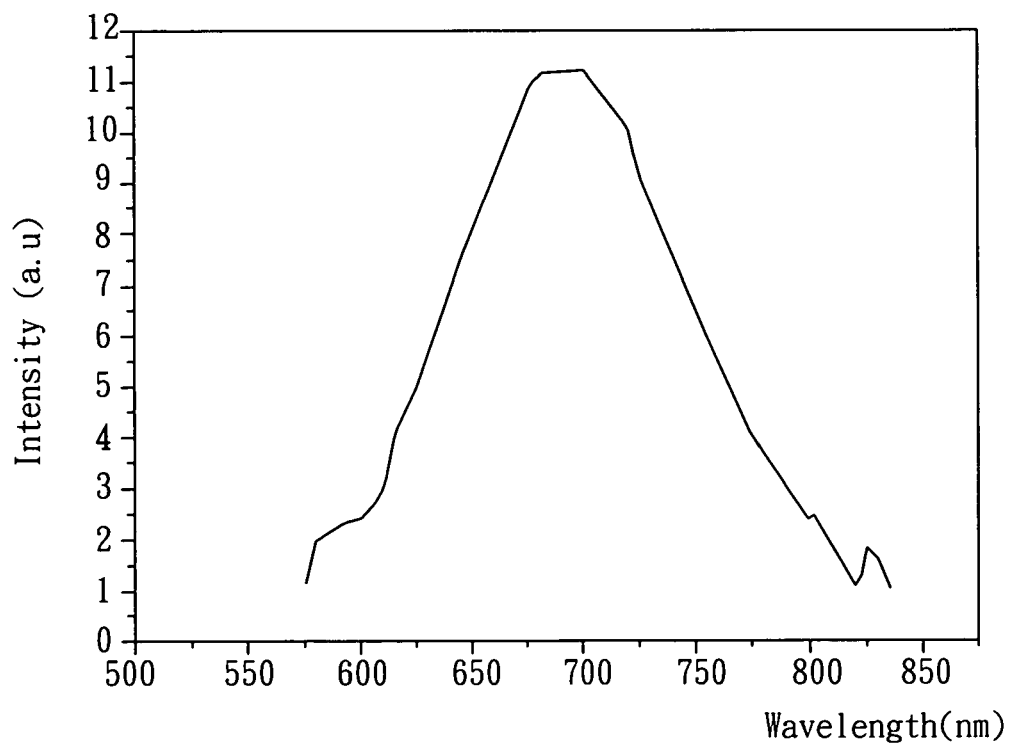
FIG. 1B shows the absorption of the poly silicon substrate surface wet etching.
Figure 2:
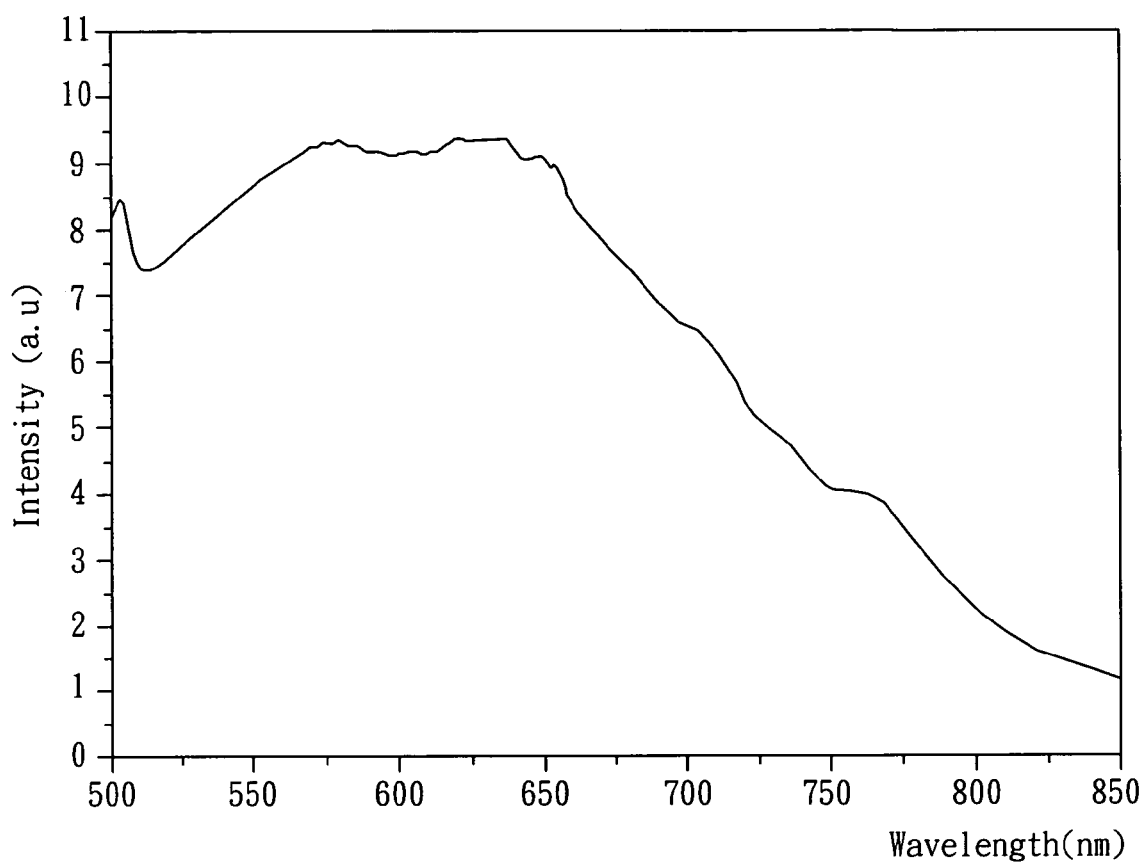
FIG. 2 shows the absorption of amorphous silicon substrate with porous structure produced by the present invention in example 1.

FIG. 2 shows the absorption of amorphous silicon substrate with porous structure produced from the procedure described above.

Example 2

A scanning electron microscope (SEM) is used to realize the surface morphology of the etched wafer.

The theory of SEM is to generate electron beams by an electron gun, wherein the electron beams are then gathered into small beam size by an optoelectronic system composed of electromagnetic lenses. The electron beams (electron probe) irradiate onto the surface of the sample. The signals created from the irradiated surface are collected and amplified, and the amplified signals are input into a cathode ray tube which scans the surface simultaneously to display the image of the sample surface.

Figure 3A:
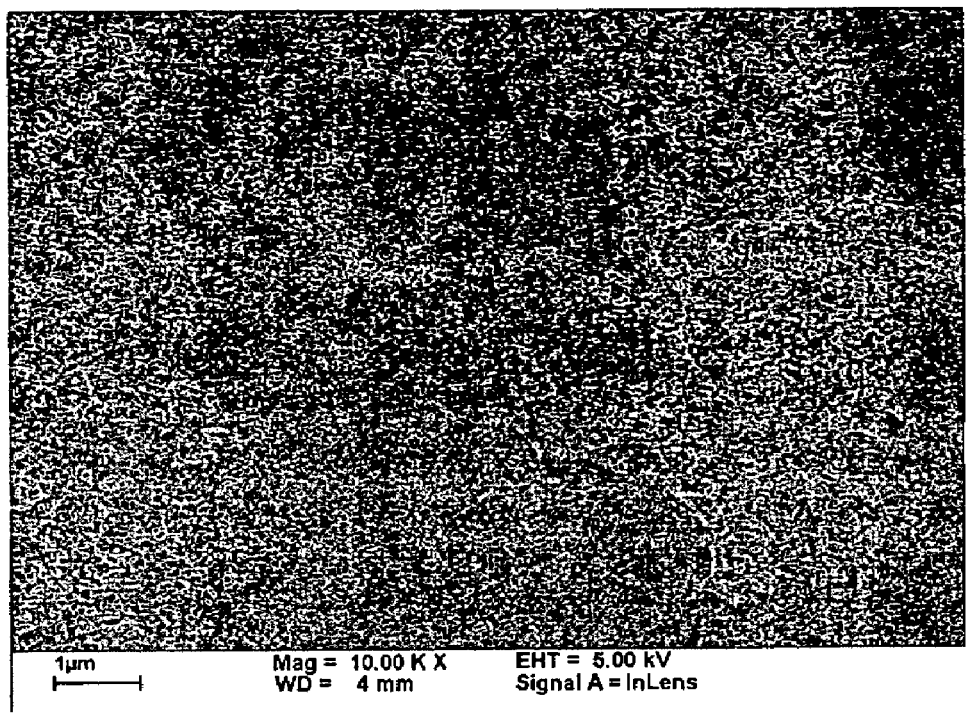
FIG. 3(a) is the morphology of a conventional poly silicon substrate with porous structure in 1,0000× ratio, and FIG.
Figure 3B:
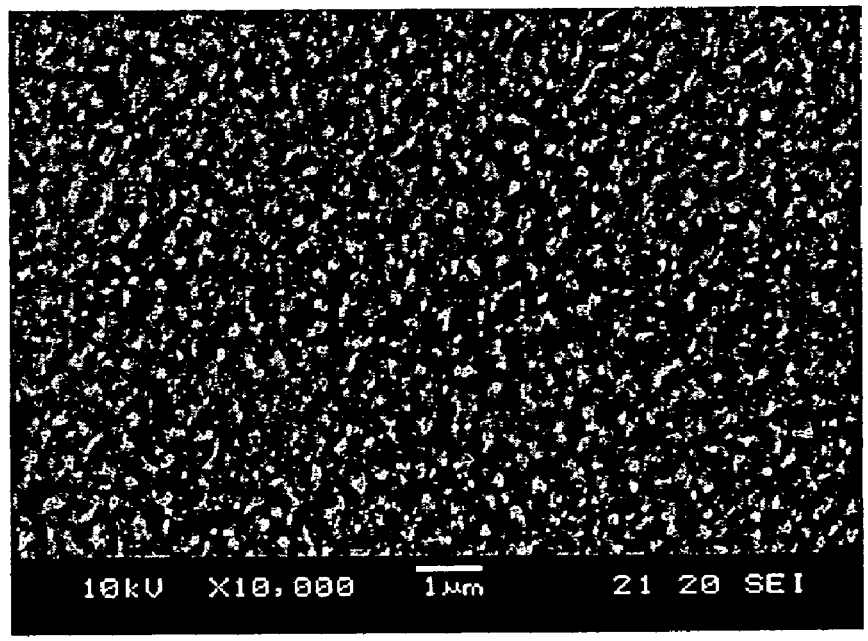
FIG. 3 represents the data observed by SEM in example 2.

The surface morphologies of both the amorphous silicon substrate with porous structure and conventional poly silicon substrates with porous structure produced from example 1 are detected by SEM, and the results are shown in FIG. 3. FIG. 3(a) represents the morphology of a conventional poly silicon substrate with porous structure in a 1,0000× ratio, and FIG. 3(b) shows the morphology of the amorphous silicon substrate with porous structure in a 10,000× ratio. The results show that after depositing an amorphous silicon thin layer on the substrate, a highly disordered surface can be obtained by the etching process.

Example 3

The surface morphologies of both the amorphous silicon with porous structure and poly silicon substrates with porous structure produced from example 1 are detected by atomic force microscopy (AFM). The AFM is often used in surface morphology detection. The working theory of AFM is to detect the interactions of the near-field electromagnetic distribution or the atomic force between a micro probe and the sample surface by the micro probe. The surface morphology of the sample is scanned and detected by the micro probe utilizing a tri-axial displacement piezoelectric ceramic scanner.

The results are shown in FIG. 4. FIG. 4(a) represents the morphology of a conventional poly silicon substrate with porous structure, and FIG. 4(b) shows the morphology of the amorphous silicon substrate with porous structure. According to the data, the etched disordered surface of the amorphous silicon substrate with porous structure is more thorough than that of conventional poly silicon substrate with porous structure. The thoroughly disordered surface is advantageous for the refraction and the scattering of incident light, thus increasing the anti-reflection effect.

Example 4

The anti-reflection effect of the substrates produced from example 1 is evaluated by use of a fluorescence spectrometer. FIGS. 5 and 6 show the spectra of reflectance. Different materials of anti-reflective substrates are provided as comparison examples to the amorphous silicon substrate with porous structure in example 1. FIG. 5 represents the reflectance of both the conventional poly silicon substrate with porous structure and the amorphous silicon substrate with porous structure. The data indicates that the reflectance of conventional poly silicon substrate with porous structure is around 10% in the wavelength range of 300-800 nm (curve A), and the reflection effect is very unstable. However, the reflectance of anti-reflective porous amorphous silicon substrate produced by the present method is kept stable at under 1% at the wavelength range of 300-800 nm (curve B).

FIG. 6 illustrates the reflectance results of substrates having different anti-reflection layers of: a silicon oxide layer deposited by plasma enhanced chemical vapor deposition (PECVD) (curve C), a silicon nitride layer deposited by PECVD (curve E), a silicon oxide layer deposited by sputtering (curve F), silicon oxide layer deposited by thermo-growth (curve D), and the conventional poly silicon substrate with porous structure prepared as described in example 1 (curve A). According to FIG. 6, only the amorphous silicon substrate with porous structure (curve B) produced by the present method has the reflectance lower than 1% among all the substrates at the wavelength range of 300-900 nm. This further confirms that the anti-reflective substrate produced by the present method has a high absorption to light.

Example 5

The anti-reflection effect of the substrates produced from example 1 is evaluated by external quantum efficiency. The substrates prepared by wet etching wafer and conventional poly silicon substrate with porous structure are detected as well as the amorphous silicon substrate with porous structure produced by the present method.

According to the result shown in FIG. 7, the external quantum efficiency of the present amorphous silicon substrate with porous structure (curve B) is higher than 90% at the wavelength range of 300-900 nm. However, the external quantum efficiency of the substrates prepared by wet etching wafer (curve G) and the conventional poly silicon substrate with porous structure (curve A) are both less than 90% at the same wavelength range of 300-900 nm. This data obviously shows the advantages of the amorphous silicon substrate with porous structure.

Although the present invention has been explained in relation to its preferred embodiment, it is to be understood that many other possible modifications and variations can be made without departing from the spirit and scope of the invention as hereinafter claimed.

What is claimed is:

1. A method for producing an anti-reflective substrate, comprising the steps of:
   (a) providing a substrate;
   (b) depositing an amorphous silicon layer as a sacrificial layer on the substrate; and
   (c) etching the sacrificial amorphous silicon layer and the substrate by chemical etching in solutions, and completely removing remaining portion of the sacrificial amorphous silicon layer from the substrate by the solutions.

2. The method as claimed in claim 1, wherein the substrate utilized in step (a) is a silicon wafer, a glass substrate, a metal substrate, or a plastic substrate.

3. The method as claimed in claim 1, wherein the substrate utilized in step (a) is a silicon wafer.

4. The method as claimed in claim 1, wherein physical vapor deposition (PVD) or chemical vapor deposition (CVD) is performed in step (b).

5. The method as claimed in claim 1, wherein the sacrificial amorphous silicon layer deposited in step (b) is in a thickness of 0.5 μm-5 μm.

6. The method as claimed in claim 1, wherein the chemical etching solutions in step (c) are hydrofluoric acid, sulfuric acid, nitric acid, phosphoric acid, or the mixture thereof.

7. The method as claimed in claim 1, wherein the effective reflectance of the anti-reflective substrate produced thereby is lower than 1%.

8. The method as claimed in claim 1, wherein the absorption of the anti-reflective substrate produced thereby is from 70% to 90% in a wavelength range of 300 nm-900 nm.

9. The method as claimed in claim 1, wherein the absorption of the anti-reflective substrate produced thereby is greater than 80% in a wavelength range of 400 nm-800 nm.

10. An anti-reflective substrate produced by a method comprising the steps of:
    a. providing a substrate;
    b. depositing an amorphous silicon layer as a sacrificial layer on the substrate; and
    c. etching the sacrificial amorphous silicon layer and the substrate by chemical etching in solutions, and completely removing remaining portion of the sacrificial amorphous silicon layer from the substrate by the solutions.

11. The substrate as claimed in claim 10, wherein the substrate utilized in step (a) is a silicon wafer, a glass substrate, a metal substrate, or a plastic substrate.

12. The substrate as claimed in claim 10, wherein the substrate utilized in step (a) is a silicon wafer.

13. The substrate as claimed in claim 10, wherein physical vapor deposition (PVD) or chemical vapor deposition (CVD) is performed in step (b).

14. The substrate as claimed in claim 10, wherein the sacrificial amorphous silicon layer deposited in step (b) is in a thickness of 0.5 μm-5 μm.

15. The substrate as claimed in claim 10, wherein the chemical etching solutions in step (c) are hydrofluoric acid, sulfuric acid, nitric acid, phosphoric acid, or the mixture thereof.

16. The substrate as claimed in claim 10, wherein the effective reflectance of the anti-reflective substrate is lower than 1%.

17. The substrate as claimed in claim 10, wherein the absorption of the anti-reflective substrate is from 70% to 90% in a wavelength range of 300 nm-900 nm.

18. The substrate as claimed in claim 10, wherein the absorption of the anti-reflective substrate is greater than 80% in a wavelength range of 400 nm-800 nm.

19. The method of claim 1, further comprising the step of:
    performing ultrasonic vibration while etching to ensure uniform etching and to keep the surface of the substrate in a highly rugged condition.

20. The substrate as claimed in claim 1, further comprising the step of:
    performing ultrasonic vibration while etching to ensure uniform etching and to keep the surface of the substrate in a highly rugged condition.

\* \* \* \* \*